United States Patent

Michael

[11] Patent Number: 5,825,078
[45] Date of Patent: Oct. 20, 1998

[54] HERMETIC PROTECTION FOR INTEGRATED CIRCUITS

[75] Inventor: Keith Winton Michael, Midland, Mich.

[73] Assignee: Dow Corning Corporation, Midland, Mich.

[21] Appl. No.: 948,570

[22] Filed: Sep. 23, 1992

[51] Int. Cl.⁶ .................................................. H01L 23/58
[52] U.S. Cl. .......................... 257/632; 257/635; 257/750
[58] Field of Search ...................... 257/637, 635, 257/632, 774, 763, 764, 750, 751; 428/688

[56] References Cited

U.S. PATENT DOCUMENTS

| | | | |
|---|---|---|---|
| 4,001,872 | 1/1977 | Khajezadeh . | |
| 4,622,576 | 11/1986 | Buynoski | 357/71 |
| 4,849,296 | 7/1989 | Haluska et al. | 428/688 |
| 4,948,754 | 8/1990 | Kondo et al. | 437/183 |
| 4,972,251 | 11/1990 | Lehrer | 357/54 |
| 4,986,878 | 1/1991 | Malazgirt et al. | 156/643 |
| 5,104,820 | 4/1992 | Go et al. | 437/51 |
| 5,117,273 | 5/1992 | Stark et al. | 257/773 |
| 5,130,275 | 7/1992 | Dion | 437/225 |
| 5,134,460 | 7/1992 | Brady et al. | 257/771 |
| 5,136,364 | 8/1992 | Byrne | 357/71 |
| 5,177,589 | 1/1993 | Kobayashi et al. | 257/763 |

FOREIGN PATENT DOCUMENTS

| | | |
|---|---|---|
| 0327412 | 8/1989 | European Pat. Off. . |
| 4201792 | 3/1982 | Germany . |
| 4118165 | 11/1983 | Germany . |
| 57048247 | 4/1991 | Japan . |
| 58166748 | 5/1992 | Japan . |
| 2184288 | 4/1981 | United Kingdom . |

*Primary Examiner*—Tom Thomas
*Assistant Examiner*—Roy Potter
*Attorney, Agent, or Firm*—Sharon K. Severance

[57] ABSTRACT

This invention relates to integrated circuits which are protected from the environment. Such circuits are hermetically sealed by applying additional ceramic layers to the primary passivation.

12 Claims, 1 Drawing Sheet

HERMETIC PROTECTION FOR INTEGRATED CIRCUITS

BACKGROUND

The present invention relates to integrated circuits which are protected from the environment. These circuits are inexpensive to fabricate and have improved performance and reliability.

Modern electronic circuits must be able to withstand a wide variety of environmental conditions such as moisture, heat, ions and abrasion. A significant amount of work has been reported directed toward various protective measures to minimize the exposure of such circuits to the above conditions and thereby increase their reliability and life.

Many prior art processes for protecting electronic circuits have involved sealing or encapsulating the circuits after they have been interconnected. For example, it is known in the art to use protective layers of silicones, polyimides, epoxies, other organics, plastics, and the like. Such materials, however, are of only limited value since most are permeable to environmental moisture and ions.

Similarly, interconnected circuits have also been sealed within ceramic packages. This process has proven to be relatively effective in increasing device reliability and is currently used in select applications. The added size, weight and cost involved in this method, however, inhibits widespread application in the electronic industry.

The use of lightweight ceramic protective coatings on electronic devices has also been suggested. For instance, Haluska et al. In U.S. Pat. Nos. 4,756,977 and 4,749,631 describe the use of ceramic silica coatings derived from hydrogen silsesquioxane and silicate esters, respectively, as well as additional ceramic layers as hermetic barriers. The present inventors have discovered that when such coatings are applied specifically to integrated circuits and the bond pads opened, the circuits are hermetically sealed.

Sealing circuits at the wafer stage is also known in the art. For example, it is known in the art to coat fabricated integrated circuits with ceramic materials such as silica and/or silicon nitride by CVD techniques. These coatings are then etched back at the bond pads for the application of leads. The wafers coated in this manner, however, are still subject to degradation, especially at the bond pads.

The present inventors have now solved the above problems associated with the hermetic protection of integrated circuits by sealing the circuits with additional CVD applied ceramic layers.

SUMMARY OF THE INVENTION

The present invention relates to hermetically sealed integrated circuits. These circuits comprise a circuit subassembly having a primary passivation and one or more bond pads opened in the passivation. To the primary passivation is applied a silicon-containing ceramic layer by a physical or chemical vapor deposition process. In addition, the ceramic layer also covers a portion of the bond pads such that the aperture of the opening is smaller than that present in the primary passivation and the bond pads, thereby, more effectively sealed.

The present invention also relates to a method for producing the above sealed integrated circuits. The method involves applying one or more ceramic layers by a physical or chemical vapor deposition process over the entire circuit subassembly followed by removing at least a portion of the ceramic layer covering the bond pads.

DETAILED DESCRIPTION OF THE INVENTION

The present invention is based on the discovery that integrated circuits can be hermetically sealed by the application of a ceramic coating over the primary passivation. These sealed circuits have increased reliability and performance. In addition, since this process is generally performed at the wafer stage, production can be simplified and, thus, costs reduced.

Figure 1:
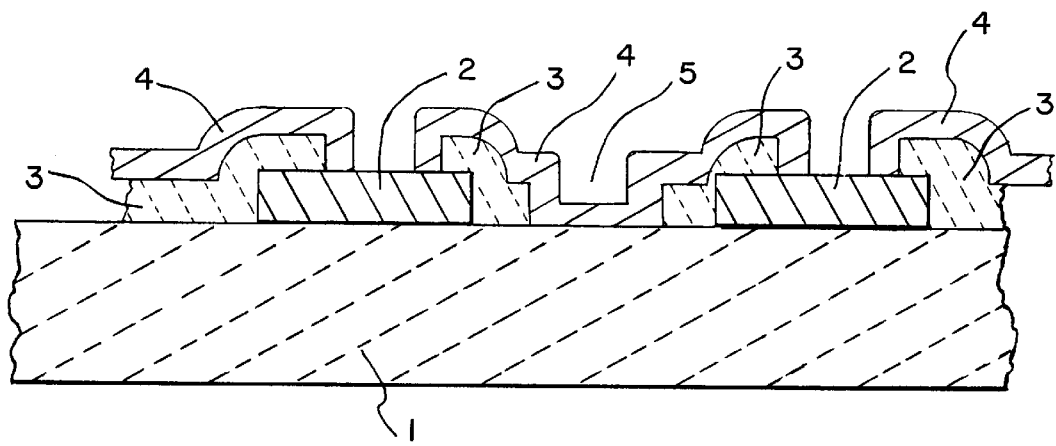
FIG. 1 is a cross-section of a semiconductor device having the passivation of the present invention.

The integrated circuit subassemblies used in the process of this invention are not critical and nearly any which are known in the art and/or produced commercially are useful herein. The processes used to produce such circuits are also known and not critical to the invention. Exemplary of such circuits are those comprising a semiconductor substrate (eg., silicon, gallium arsenide, etc.) having an epitaxial layer grown thereon. This epitaxial layer is appropriately doped to form the PN-junction regions which constitute the active regions of device. These active regions are diodes and transistors which form the integrated circuit when appropriately interconnected by a properly patterned metallic layer. This metallic interconnect layer terminates at the bond pads on the exterior surface of the circuit. To protect the exterior surface of the circuit, a primary passivation is applied and the passivation then etched back at the bond pads to allow subsequent dicing and interconnection of the circuit to form the active device. FIG. 1 depicts a cross-section of such a semiconductor substrate wherein (1) is the semicondutor substrate, (2) is the bond pad and (3) is the primary passivation.

The passivation described above conventionally comprises one or more ceramic coatings applied by chemical vapor deposition techniques. Theses coating can comprise, for example, silica, silicon nitride or silicon oxynitride derived from precursors such as silane and oxygen, nitrous oxide, nitrogen, ammonia or the like.

Despite the fact that these circuits have a passivation layer, they are still prone to damage by the environment. For example, the passivation is prone to penetration of water and/or various destructive ions through defects and cracks. As noted above, the circuit industry has attempted to solve these problems by the use of additional protective measures after the circuits are interconnected. The present invention, on the other hand, describes additional measures to be taken before interconnection of the circuit.

In the process of the present invention, the above circuits are sealed by covering the primary passivation with one or more additional ceramic layers by a physical vapor deposition (PVD) or chemical vapor deposition (CVD) process. This is shown in FIG. 1 wherein (4) is the additional ceramic layers. These ceramic layers can include, for example, silicon oxygen containing coatings, silicon containing coatings, silicon carbon containing coatings, silicon nitrogen containing coating, silicon oxygen nitrogen coatings, silicon nitrogen carbon containing coatings, silicon oxygen carbon containing coatings, silicon oxygen carbon nitrogen containing coatings and/or diamond like carbon coatings.

The materials and methods for the formation of these ceramic coatings are not critical to the invention and many are known in the art. Examples of applicable methods include chemical vapor deposition, photochemical vapor deposition, plasma enhanced chemical vapor deposition (PECVD), electron cyclotron resonance (ECR), jet vapor deposition, sputtering, electron beam evaporation, or any similar technique may be used. These processes involve either the addition of energy (in the form of heat, plasma, etc.) to a vaporized species to cause the desired reaction or the focusing of energy on a solid sample of the material to cause its deposition.

In chemical vapor deposition, the coating is deposited by passing a stream of the desired precursor gases over a heated substrate. When the precursor gases contact the hot surface, they react and deposit the coating. Substrate temperatures in the range of about 100°–1000° C. are sufficient to form these coatings in several minutes to several hours, depending on the precursors and the thickness of the coating desired. If desired, reactive metals can be used in such a process to facilitate deposition.

In PECVD, the desired precursor gases are reacted by passing them through a plasma field. The reactive species thereby formed are then focused at the substrate and readily adhere. Generally, the advantage of this process over CVD is that lower substrate temperature can be used. For instance, substrate temperatures of about 20° up to about 600° C. are functional.

The plasma used in such processes can comprise energy derived from a variety of sources such as electric discharges, electromagnetic fields in the radio-frequency or microwave range, lasers or particle beams. Generally preferred in most plasma deposition processes is the use of radio frequency (10 kHz–$10^2$ MHz) or microwave (0.1–10 GHz) energy at moderate power densities (0.1–5 watts/cm$^2$). The specific frequency, power and pressure, however, are generally tailored to the precursor gases and the equipment used.

Examples of suitable processes for the deposition of the silicon containing coating described above include (a) the chemical vapor deposition of a silane, halosilane, halodisilane, halopolysilane or mixtures thereof, (b) the plasma enhanced chemical vapor deposition of a silane, halosilane, halodisilane, halopolysilane or mixtures thereof, or (c) the metal assisted chemical vapor deposition of a silane, halosilane, halodisilane, halopolysilane or mixtures thereof.

Examples of suitable processes for the deposition of the silicon carbon containing coating described above include (1) the chemical vapor deposition of a silane, alkylsilane, halosilane, halodisilane, halopolysilane or mixtures thereof in the presence of an alkane of one to six carbon atoms or an alkylsilane, (2) the plasma enhanced chemical vapor deposition of a silane, alkylsilane, halosilane, halodisilane, halopolysilane or mixtures thereof in the presence of an alkane of one to six carbon atoms or an alkylsilane or (3) the plasma enhanced chemical vapor deposition of a silacyclobutane or disilacyclobutane as further described in U.S. Pat. No. 5,011,706, which is incorporated herein in its entirety.

Examples of suitable processes for the deposition of the silicon oxygen carbon containing coating described above include (1) the chemical vapor deposition of a silane, alkylsilane, halosilane, halodisilane, halopolysilane or mixtures thereof in the presence of an alkane of one to six carbon atoms or an alkylsilane and further in the presence of an oxidizing gas such as air, oxygen, ozone, nitrous oxide and the like, (2) the plasma enhanced chemical vapor deposition of a silane, alkylsilane, halosilane, halodisilane, halopolysilane or mixtures thereof in the presence of an alkane of one to six carbon atoms or an alkylsilane and further in the presence of an oxidizing gas such as air, oxygen, ozone, nitrous oxide and the like or (3) the plasma enhanced chemical vapor deposition of a silacyclobutane or disilacyclobutane as further described in U.S. Pat. No. 5,011,706, which is incorporated herein in its entirety, in the presence of an oxidizing gas such as air, oxygen, ozone, nitrous oxide and the like.

Examples of suitable processes for the deposition of the silicon nitrogen containing coating described above include (A) the chemical vapor deposition of a silane, halosilane, halodisilane, halopolysilane or mixtures thereof in the presence of ammonia, (B) the plasma enhanced chemical vapor deposition of a silane, halosilane, halodisilane, halopolysilane, or mixtures thereof in the presence of ammonia, (C) the plasma enhanced chemical vapor deposition of a $SiH_4$—$N_2$ mixture such as that described by Ionic Systems or that of Katoh et al. in the Japanese Journal of Applied Physics, vol. 22, #5, pp1321–1323, (D) reactive sputtering such as that described in Semiconductor International, p 34, August 1987.

Examples of suitable processes for the deposition of the silicon oxygen nitrogen containing coating described above include (A) the chemical vapor deposition of a silane, halosilane, halodisilane, halopolysilane or mixtures thereof in the presence of ammonia and an oxidizing gas such as air, oxygen, ozone, nitrous oxide and the like, (B) the plasma enhanced chemical vapor deposition of a silane, halosilane, halodisilane, halopolysilane, or mixtures thereof in the presence of ammonia and an oxidizing gas such as air, oxygen, ozone, nitrous oxide and the like, (C) the plasma enhanced chemical vapor deposition of a $SiH_4$—$N_2$ mixture such as that described by Ionic Systems or that of Katoh et al. in the Japanese Journal of Applied Physics, vol. 22, #5, pp1321–1323 in the presence of an oxidizing gas such as air, oxygen, ozone, nitrous oxide and the like, or (D) reactive sputtering such as that described in Semiconductor International, p 34, August 1987 in the presence of an oxidizing gas such as air, oxygen, ozone, nitrous oxide and the like.

Examples of suitable processes for the deposition of the silicon oxygen containing coating described above include (A) the chemical vapor deposition of a silane, halosilane, halodisilane, halopolysilane or mixtures thereof in the presence of an oxidizing gas such as air, oxygen, ozone, nitrous oxide and the like, (B) the plasma enhanced chemical vapor deposition of a silane, halosilane, halodisilane, halopolysilane, or mixtures thereof in the presence of an oxidizing gas such as air, oxygen, ozone nitrous oxide and the like, (c) the chemical vapor deposition or plasma enhanced chemical vapor deposition of tetraethylorthosilicate, methyltrimethoxysilane, methylhydrogensiloxanes, dimethylsiloxanes and the like in the presence of an oxidizing gas such as air, oxygen, ozone, nitrous oxide and the like, or (d) the chemical vapor deposition or plasma enhanced chemical vapor deposition of hydrogen silsesquioxane resin in the presence of an oxidizing gas such as air, oxygen, ozone, nitrous oxide and the like as described in US Patent No., which is incorporated herein by reference.

Examples of suitable processes for the deposition of the silicon carbon nitrogen containing coating described above include (i) the chemical vapor deposition of hexamethyldisilazane, (ii) the plasma enhanced chemical vapor deposition of hexamethyldisilazane, (iii) the chemical vapor deposition of silane, alkylsilane, halosilane, halodisilane, halopolysilane or mixture thereof in the presence of an alkane of one to six carbon atoms or an alkylsilane and further in the presence of ammonia, or (iv) the plasma enhanced chemical vapor deposition of a silane, alkylsilane, halosilane, halodisilane, halopolysilane or mixture thereof in the presence of an alkane of one to six carbon atoms or an alkylsilane and further in the presence of ammonia.

Examples of suitable processes for the deposition of the silicon oxygen carbon nitrogen containing coating described above include (i) the chemical vapor deposition of hexamethyldisilazane in the presence of an oxidizing gas such as air, oxygen, ozone, nitrous oxide and the like, (ii) the plasma enhanced chemical vapor deposition of hexamethyldisilazane in the presence of an oxidizing gas such as air, oxygen, ozone, nitrous oxide and the like, (iii) the chemical vapor deposition of silane, alkylsilane, halosilane, halosilane, halopolysilane or mixture thereof in the presence of an alkane of one to six carbon atoms or an alkylsilane and further in the presence of ammonia and an oxidizing gas such as air, oxygen, ozone, nitrous oxide and the like, or (iv) the plasma enhanced chemical vapor deposition of a silane, alkylsilane, halosilane, halodisilane, halopolysilane or mixture thereof in the presence of an alkane of one to six carbon atoms or an alkylsilane and further in the presence of ammonia and an oxidizing gas such as air, oxygen, ozone, nitrous oxide and the like.

Examples of suitable processes for the deposition of the diamond-like carbon coating described above include exposing the substrate to an argon beam containing a hydrocarbon in the manner described in NASA Tech Briefs, November 1989 or by one of the methods described by Spear in J. Am. Ceram. Soc., 72, 171–191 (1989).

Figure 2:
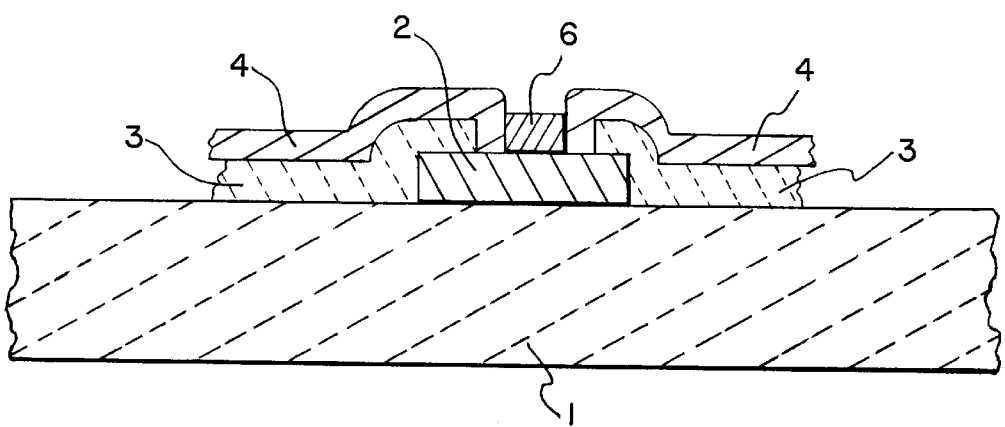
FIG. 2 is a cross-section of a semiconductor device having the passivation and metallization of the present invention.

After the ceramic layers are applied, the coating covering the bond pads is partially etched to allow for attachment of leads. The method of etching is not critical and nearly any process known in the art will function herein. This includes, for example, dry etching (eg., with plasma), wet etching (eg., with aqueous hydrofluoric acid) and/or laser ablation. If desired, the open bond pads can then be sealed by covering them with one or more non-corroding, conductive layers. The material used for this layer is not critical and can comprise any which is stable in the environment, electrically conductive, and useful for interconnecting the circuit. Examples of such materials include gold, copper, silver, tungsten, solder, silver filled epoxy and the like. FIG. 2 depicts a cross-section of a semiconductor substrate (1) having a bond pad (2), a primary passivation (3), additional ceramic layers (4) and the non-corroding conductive layers (6).

The method for applying this layer or layers is likewise not critical. Examples of such processes include sputtering, electron beam evaporation or by merely dispensing the material at the bond pad. These and other processes are known in the art for use within the multiple layers of the circuit and are functional herein.

It should be noted that the materials of the bond pad (eg., aluminum) are often incompatible with the materials of the non-corroding, conductive layer (eg, gold) such that when they are brought into contact with each other intermetallic formation ("purple plague") can damage the circuit. To prevent such damage, it is within the scope of this invention to first apply a diffusion barrier metal layer to the bond pads followed by application of the conductive layers as set forth above. The diffusion barrier metal layers useful herein are known in the art for use within integrated circuits for building the multiple layers of the circuit. Generally, such layers comprise metals such as tungsten or metal alloys such as titanium-tungsten, titanium nitride, and the like.

The method for forming the diffusion barrier metal layers is not critical and many techniques are known in the art. A common approach involves sputtering the diffusion barrier metal layer on the surface of the circuit followed by etching.

If the bond pads are sealed with this conductive layer, additional ceramic coatings may be added to the above ceramic layers by the methods described above to further seal the circuit.

The above sealing processes can be performed at the wafer stage or after dicing. It is preferred herein, however, to seal the devices at the wafer stage for efficiency reasons.

The aperture of the open bond pad is decreased by this process such that the original etching in the primary passivation is further sealed. Note FIGS. 1 and 2 which shown that the aperture of the opening above the bond pad (2) is decreased by the additional ceramic layers (4). This includes, for example, sealing the sides of the original etched primary passivation (eg., at the bond pads and streets (Note FIG. 2 which shows that the edges of the primary passivation (3) at the bond pads (2) and the streets (5) are sealed by the additional ceramic layers (4)) and the junction of the original etched primary passivation and the bond pads. In addition, any cracks, pinholes or defects in the original passivation are sealed.

Such circuits are then interconnected with each other, with a lead frame, with a circuit board or other external components. Such interconnection can be by conventional leads or by methods such as TAB or "flip chip" processes which are well known in the art.

After interconnection, the device can also be packaged by conventional techniques known in the art. For instance, the device can be embedded within an organic encapsulant such as a polyimide, an epoxy or PARYLENE™, it can be embedded within a silicone encapsulant or it can be included in a plastic package for additional protection.

That which is claimed is:

1. A hermetically sealed integrated circuit comprising:

a circuit subassembly having bond pads and streets;

a primary passivation layer on the surface of the subassembly which is etched at the bond pads and streets; and one or more ceramic layers covering the primary passivation layer and the sides of the primary passivation created by etching at the bond pads and streets;

wherein the ceramic layers comprise a ceramic material which is deposited by a process selected from the group consisting of chemical vapor deposition and physical vapor deposition.

2. The integrated circuit of claim 1 wherein the ceramic layer is selected from the group consisting of silicon containing ceramics, silicon oxygen containing ceramics, silicon nitrogen containing ceramic, silicon oxygen nitrogen containing ceramics, silicon oxygen carbon containing ceramics, silicon carbon nitrogen containing ceramics, silicon oxygen carbon nitrogen containing ceramics, silicon carbon containing ceramics and diamond-like carbon containing ceramics.

3. The integrated circuit of claim 1 which has been interconnected and embedded within a material selected from the group consisting of organic encapsulants and silicon encapsulants.

4. A hermetically sealed integrated circuit comprising:

a circuit subassembly having bond pads and streets;

a primary passivation layer on the surface of the subassembly which is etched at the bond pads and streets;

one or more ceramic layers covering the primary passivation layer and the sides of the primary passivation created by etching at the bond pads and streets; and a non-corroding, conductive layer covering the bond pads;

wherein the ceramic layers comprise a ceramic material which is deposited by a process selected from the group consisting of chemical vapor deposition and physical vapor deposition.

5. The integrated circuit of claim 4 wherein the ceramic layer is selected from the group consisting of silicon containing ceramics, silicon oxygen containing ceramics, silicon nitrogen containing ceramic, silicon oxygen nitrogen containing ceramics, silicon oxygen carbon containing ceramics, silicon carbon nitrogen containing ceramics, silicon oxygen carbon nitrogen containing ceramics, silicon carbon containing ceramics and diamond-like carbon containing ceramics.

6. The integrated circuit of claim 4 wherein the non-corroding, conductive layers comprise a material selected from the group consisting of gold, silver, tungsten, solder, silver filled epoxy and copper.

7. The integrated circuit of claim 4 which has been interconnected and embedded within a material selected from the group consisting of organic encapsulants and silicon encapsulants.

8. A hermetically sealed integrated circuit comprising:

a circuit subassembly having bond pads and streets;

a primary passivation layer on the surface of the subassembly which is etched at the bond pads and streets;

one or more ceramic layers covering the primary passivation layer and the sides of the primary passivation created by etching at the bond pads and streets;

a diffusion barrier metal layer covering the bond pads; and a non-corroding, conductive layer covering the diffusion barrier metal layer;

wherein the ceramic layers comprise a ceramic material which is deposited by a process selected from the group consisting of chemical vapor deposition and physical vapor deposition.

9. The integrated circuit of claim 8 wherein the ceramic layer is selected from the group consisting of silicon containing ceramics, silicon oxygen containing ceramics, silicon nitrogen containing ceramic, silicon oxygen nitrogen containing ceramics, silicon oxygen carbon containing ceramics, silicon carbon nitrogen containing ceramics, silicon oxygen carbon nitrogen containing ceramics, silicon carbon containing ceramics and diamond-like carbon containing ceramics.

10. The integrated circuit of claim 8 wherein the non-corroding, conductive layers comprise a material selected from the group consisting of gold, silver, tungsten, solder, silver filled epoxy and copper.

11. The integrated circuit of claim 8 wherein the diffusion barrier metal layer is selected from the group consisting of titanium, an alloy of titanium and tungsten and titanium nitride.

12. The integrated circuit of claim 8 which has been interconnected and embedded within a material selected from the group consisting of organic encapsulants and silicone encapsulants.

* * * * *